United States Patent [19]

Khan et al.

[11] Patent Number: 5,403,546
[45] Date of Patent: Apr. 4, 1995

[54] NICKEL-BASED SUPERALLOY FOR INDUSTRIAL TURBINE BLADES

[75] Inventors: Tasadduq Khan, Jouy-en-Josas; Pierre Caron; Jean-Louis Raffestin, both of Les Ulis; Serge Naveos, Plessis Robinson, all of France

[73] Assignee: Office National D'Etudes et de Recherches/Aerospatiales, Chatillon Sous Bagneux, France

[21] Appl. No.: 162,904

[22] Filed: Dec. 8, 1993

Related U.S. Application Data

[63] Continuation of Ser. No. 950,768, Sep. 24, 1992, abandoned, which is a continuation-in-part of Ser. No. 463,561, Jan. 11, 1990, abandoned.

[30] Foreign Application Priority Data

Feb. 10, 1989 [FR] France .................. 89 01774

[51] Int. Cl.$^6$ ................................. C22C 19/05
[52] U.S. Cl. .................. 420/448; 416/241 R
[58] Field of Search ............. 420/448; 148/404, 410, 148/428; 415/200; 416/241 R

[56] References Cited

U.S. PATENT DOCUMENTS

| | | | |
|---|---|---|---|
| 3,617,261 | 2/1971 | Lherbier et al. | 148/428 |
| 3,969,111 | 7/1976 | Acuncius et al. | 148/410 |
| 4,116,723 | 9/1978 | Gell et al. | 148/404 |
| 4,379,120 | 4/1983 | Whitney et al. | 148/410 |
| 4,388,124 | 6/1983 | Henry | 148/404 |
| 4,492,672 | 1/1985 | Duhl et al. | 420/448 |
| 4,830,934 | 5/1989 | Ferrigno et al. | 428/678 |

FOREIGN PATENT DOCUMENTS

| | | |
|---|---|---|
| 0076360 | 4/1983 | European Pat. Off. |
| 2519033 | 7/1983 | France . |
| 1666686 | 10/1969 | United Kingdom . |
| 2073774 | 10/1981 | United Kingdom . |
| 2153845 | 8/1985 | United Kingdom . |

*Primary Examiner*—Deborah Yee
*Attorney, Agent, or Firm*—Armstrong, Westerman, Hattori, McLeland & Naughton

[57] ABSTRACT

A nickel-based superalloy suitable for directed solidification, in particular for industrial gas turbine parts, having the following composition by weight:

Co: 0 to 5%
Cr: 13 to 16%
W: 0 to 2%
Mo: 2 to 3.5%
Al: 3.5 to 4%
Ti: 3.5%
Ta: 3.5 to 4%
Hf: 0 to 1%
C: 0 to 660 ppm
Zr: 0 to 150 ppm
B: 0 to 150 ppm
Ni: balance up to 100%

2 Claims, 2 Drawing Sheets

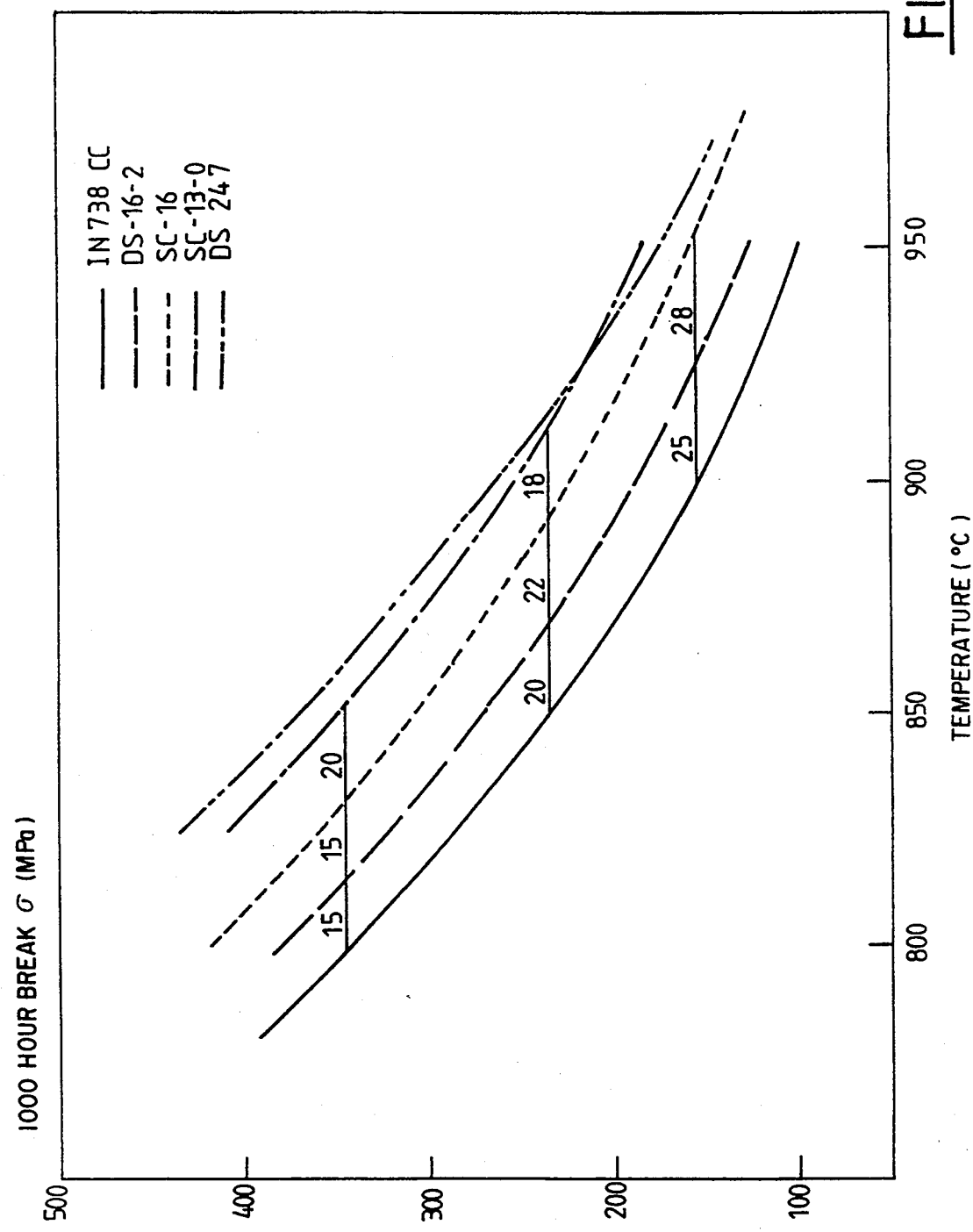

NICKEL-BASED SUPERALLOY FOR INDUSTRIAL TURBINE BLADES

This application is a continuation of prior application Ser, No. 07/950,768, filed Sep. 24, 1992, which is a continuation-in-part of prior application Ser. No. 07/463,561, filed Jan. 11, 1990, both abandoned.

BACKGROUND OF THE INVENTION

In order to obtain excellent efficiency from gas turbines, it is necessary to run them at high temperatures, and this requires materials to be developed which have very high creep resistance at these high temperature. The most effective materials in this respect are nickel-based superalloys made by directed solidification and having a structure which is either of the "monocrystalline" type or else of the "column grain" type parts made of "monocrystalline" superalloys in fact comprise a monostalline gamma matrix in which gamma prime particles are dispersed, said particles cohering with the matrix in such a manner that together they possess substantially the same properties as a single crystal.

Column grain superalloys are constituted by juxtaposed elongate grains extending in the solidification direction, with the structure of each grain being similar to that of a "monocrystalline" superalloy.

These prior alloys are made by directed solidification and are used to make turbine blades for aviation purposes. However, they are not suitable for industrial (or ground-based) turbines since their resistance to corrosion over time is inadequate given the very long period of operation of such turbines, generally between 50,000 hours and 100,000 hours. The alloy used most frequently at present for making industrial turbine blades is the alloy called IN 738. It has excellent resistance to corrosion and good resistance to creep. However, with respect to creep, it is much less good than the above-mentioned monostalline or column grain superalloys. Attempts at applying the directed solidification technique to alloys of the IN 738 type have not been successful.

The object of the invention is to provide a nickel-based superalloy which, at high temperatures, simultaneously presents resistance to corrosion that is at least as good as that of the alloy IN 738, together with substantially improved resistance to creep. Such a superalloy is particularly suitable for making the blades of industrial gas turbines, and also for making the second stage blades of aviation gas turbines.

SUMMARY OF THE INVENTION

According to the invention, this aim is achieved by a superalloy suitable for directed solidification, and having the following composition by weight:
Co: 0 to 5%
Cr: 13 to 16%
W: 0 to 2%
Mo: 2 to 3.5%
Al: 3.5 to 4%
Ti: 3.5%
Ta: 3.5 to 4%
Hf: 0 to 1%
C: 0 to 660 ppm
Zr: 0 to 150 ppm
B: 0 to 150 ppm
Ni: balance up to 100%

With the above composition, alloys suitable for monocrystalline solidification are obtained when the concentrations of Co, Hf, C, Zr, and B are practically zero.

In contrast, the alloy is more particularly suitable for solidification in column grains when its composition by weight is the following:
Co: 0 to 5%
Cr: 16%
Mo: 3%
Al: 3.5%
Ti: 3.5%
Ta: 3.5%
Hf: 1%
C: 660 ppm
Zr: 150 ppm
B: 150 ppm
Ni: balance up to 100%

The invention also provides a gas turbine blade made from a superalloy as defined above.

BRIEF DESCRIPTION OF THE DRAWINGS

Other features and advantages of the invention appear from the following detailed description and the accompanying drawings, in which:

FIG. 2 is a graph showing changes in creep resistance of various alloys as a function of temperature.

DETAILED DESCRIPTION

Figure 1:
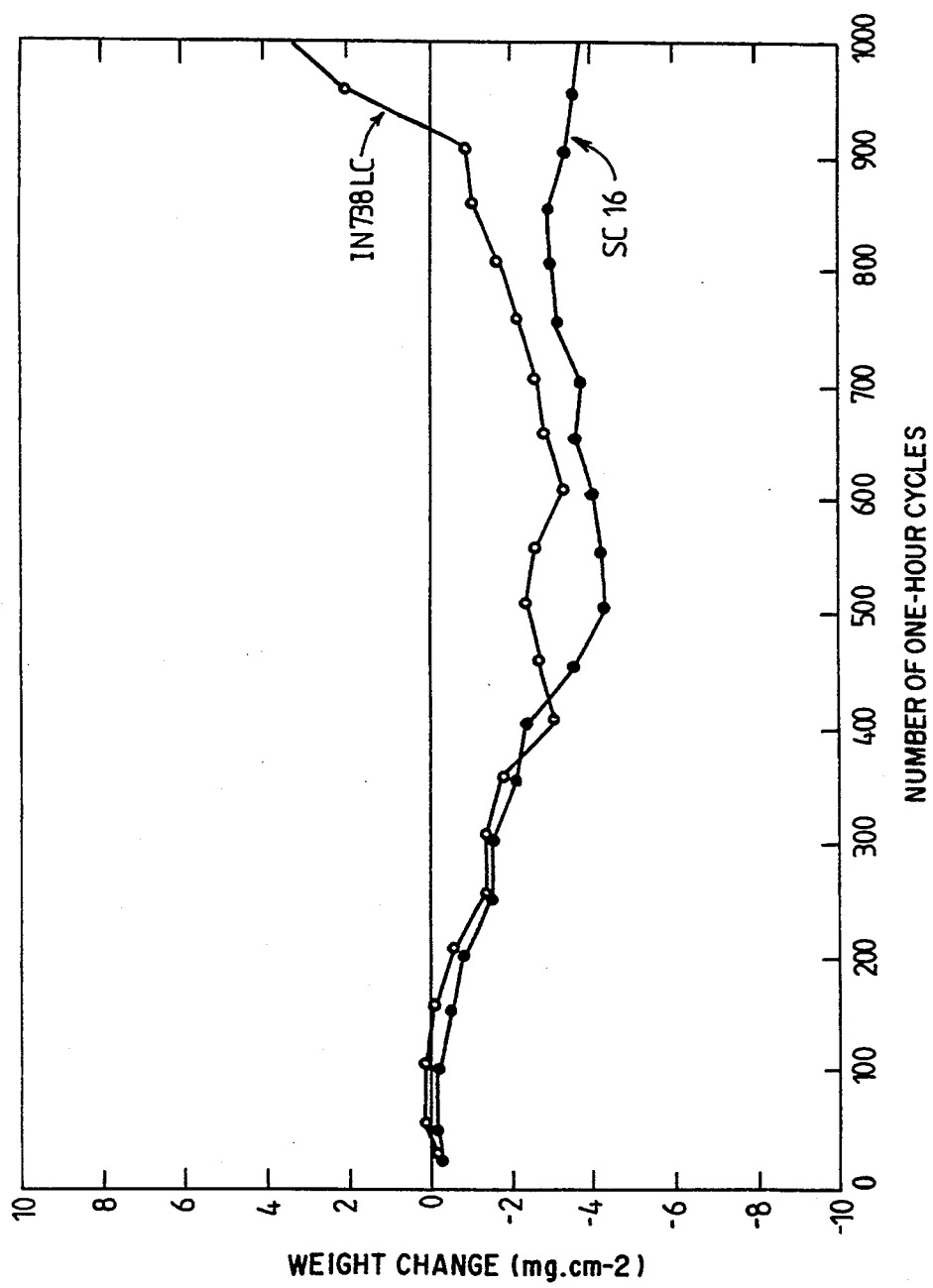
FIG. 1 is a graph showing changes in weight of a sample of alloy in accordance with the invention and a sample of the alloy IN 738 during a hot corrosion test.

Five superalloys of the invention were prepared having approximate compositions as given in accompanying Table 1. The weight concentrations are given in ppm (parts per million) for the elements C, Zr, and B, and in percentage for the other elements, with the balance up to 100% being constituted by nickel.

These alloys were subjected to heat treatment for putting the gamma prime phase into solution and reprecipitating it as described in French patent specification FR-A-2 503 188, with the temperatures and the durations of the treatment being selected each time so as to optimize the properties of the alloy, in a manner that comes within the competence of a person skilled in the art.

Thus, the alloy referenced SC 16 was heated to 1250° C. for one hour and then cooled in air in order to put the gamma prince phase into solution. The alloy SC 16-2 was heated to 1245° C. for one hour and then cooled in air. The alloy SC 13-0 was heated to 1260° C. for two hours, and then its temperature was raised to 1275° C. in one hour and maintained at that value for three hours, after which the alloy was cooled in air. The alloys DS 16-1 and DS 16-2 were heated to 1150° C. for three hours, then their temperature was raised over one hour to 1200° C. and maintained at that value for two hours, after which they were cooled in air and then reheated to 1220° C. for three hours prior to being cooled a second time in air.

For all of these alloys, the gamma prime phase was reprecipitated by heating to 1100° C. for four hours, followed by cooling in air prior to reheating to 850° C. for 24 hours and cooling in air again. This provided uniform distribution of the gamma prime particles throughout the alloy, with the size of the particles lying in the range 0.2 microns ($\mu$m) to 0.8 $\mu$m.

Table 1 also specifies for each alloy, its density d in grams per cubic centimeter (g/cm³), the volume percentage of its gamma prime phase (% $\gamma''$), and the parameter Nv (number of electron holes ) defined as follows:

$$Nv = 0.66Ni + 1.71Co + 2.66Fe + 3.66Mn + 5.66V + 6.66Si + 9.66(Mo+W) + 4.66Cr + 7.66Al + 6.66Ti$$

where the element symbols represent atom concentrations of the corresponding elements in the alloy matrix.

As is well known in the art, When the parameter Nv is greater than 2.45, the alloy is in danger of being unstable, i.e. of having parasitic phases such as the sigma and mu phases precipitating therein during prolonged utilization. All of the alloys of the invention have a value of Nv which is less than 2.45.

Table 2 is analogous to Tablet 1, and relates to alloys whose compositions are close to alloys of the invention, but which are nevertheless different therefrom.

The alloy SC 13-2 was subjected to treatment for putting the gamma prime phase into solution similar to that used on the alloy SC 13-0, except insofar as thee second stage temperature was raised to 1280° C. The alloy SC 13-3 was heated to 1250° C. for two hours and then its temperature was raised over one hour to 1270° C. and maintained at this value for three hours, after which the alloy was cooled in air. Both of these alloys were then subjected to precipitation treatment similar to that used for the alloys in Table 1.

It can be seen from Table 2 that the volume fraction of the gamma prime phase is higher than it is for the alloys in Table 1. This gives rise to increased concentrations of Cr, Mo, and W in the matrix, i.e. in the gamma phase. As a result the parameter Nv is greater than 2.45 and these alloys are unstable.

The curves of FIG. 1 which relate to corrosion resistance testing show the changes in Weight of a sample of the alloy IN 738 and a sample of the alloy SC 16 respectively as a function of the number of thermal cycles to which they were subjected, with each Cycle comprising maintaining at 850° C. for one hour in air at atmospheric pressure and being cooled to ambient temperature, with the samples being contaminated using Na₂SO₄ (0.5 mg.cm⁻² and renewed every 50 hours). The behavior of both samples during the first 900 cycles was not significantly different: in both cases they lost weight, but less than 5 milligrams per square centimeter, and this indicates that corrosion was not appreciable. Between 900 and 1000 cycles, this behavior did not change for the alloy SC 16, however the alloy IN 738 began a sudden increase in weight. The alloy SC 16 therefore appears to be at least as good as the alloy IN 738 with respect to hot corrosion performance, unlike all of the monocrystalline alloys known in the past.

Tables 3 to 6 give the results of hot creep tests on the alloys SC 16, SC 13-0, SC 13-2, and SC 13-3, respectively. The curves of FIG. 2 show the change in thousand-hour breaking stress sigma as a function of temperature for the alloys SC 16, SC 13-0, and DS 16-2, for the alloy having the reference IN 738, and for another prior alloy called DS-MAR-M 247, which is commonly used in aviation turbines.

It can be seen that the curve relating to the alloy DS-MAR-M 247 is offset to the right by about 60° C. relative to the curve for the alloy IN 738, which corresponds to a temperature increase of 60° C. However, the alloy DS 247 is not suitable for use in industrial turbines because of its inadequate resistance to corrosion.

The alloy SC 13-0 of the invention has creep performance very close to that of the alloy DS 247. The alloy SC 16 provides a temperature improvement over the alloy IN 738 running from about 30° C. (830° C. instead of 800° C.) to about 50° C. (950° C. instead of 900° C.). The improvement provided by the alloy DS 16-2, which is not in accordance with the invention, is considerably less.

By comparing Tables 3 and 5, it can be seen that because of its instability, the ductility of the alloy SC 13-2 becomes less (1.6% at 850° C. under 350 MPa, instead of 17.8%).

TABLE 1

| Ref | Co | Cr | W | Mo | Al | Ti | Ta | Hf | C | Zr | B | d | % $\gamma'$ | Nv |
|-----|----|----|----|----|----|----|----|----|----|----|----|----|----|----|
| SC 16 | — | 16 | — | 3 | 3.5 | 3.5 | 3.5 | — | — | — | — | 8.21 | 48.1 | 2.35 |
| SC 16-2 | — | 16 | 2 | 2 | 3.5 | 3.5 | 3.5 | — | — | — | — | 8.30 | 50.0 | 2.38 |
| SC 13-0 | — | 13 | — | 5 | 4 | 3.5 | 4 | — | — | — | — | 8.22 | 54.7 | 2.30 |
| DS 16-1 | — | 16 | — | 3 | 3.5 | 3.5 | 3.5 | 1 | 600 | 150 | 150 | 8.27 | 50.3 | 2.36 |
| DS 16-2 | 5 | 16 | — | 3 | 3.5 | 3.5 | 3.5 | 1 | 600 | 150 | 150 | 8.25 | 50.4 | 2.44 |

TABLE 2

| Ref | Co | Cr | W | Mo | Al | Ti | Ta | Hf | C | Zr | B | d | % $\gamma'$ | Nv |
|-----|----|----|----|----|----|----|----|----|----|----|----|----|----|----|
| SC 13-2 | 5 | 13 | 2 | 3 | 4.5 | 3 | 4 | — | — | — | — | 8.29 | 59.7 | 2.54 |
| SC 13-3 | 5 | 13 | 2 | 3 | 5.5 | 3 | 3.5 | — | — | — | — | 8.13 | 75.8 | 3.12 |

TABLE 3

| | | Alloy SC-16 | | |
|---|---|---|---|---|
| Temperature (°C.) | Stress (MPa) | Time for 1% Deformation (h) | Breaking Time (h) | Extension (%) |
| 850 | 400 | 22 | 138 | 18.6 |
| | 350 | 84 | 402 | 17.8 |
| | 300 | 268 | 1060 | 11.0 |
| 950 | 200 | 61 | 287 | 17.9 |
| | 175 | 193 | 626 | 19.5 |
| | 120 | 4000 | 5354 | 11.5 |
| 1050 | 100 | 69 | 130 | 17.2 |

TABLE 4

| | | Alloy SC 13-0 | | |
|---|---|---|---|---|
| Temperature (°C.) | Stress (MPa) | Time for 1% Deformation (h) | Breaking Time (h) | Extension (%) |
| 850 | 400 | 97 | 368 | 15.9 |
| | 300 | 1640 | >2088 | >1.3 |
| 950 | 200 | 152 | 628 | 14.4 |
| | 175 | 790 | 1508 | 11.0 |

TABLE 5

Alloy SC 13-2

| Temperature (°C.) | Stress (MPa) | Time for 1% Deformation (h) | Breaking Time (h) | Extension (%) |
| --- | --- | --- | --- | --- |
| 850 | 400 | 190 | 419 | 13.5 |
|  | 350 | 422 | 452 | 1.6 |
|  | 300 | 612 | 879 | 6.5 |

TABLE 6

Alloy SC 13-3

| Temperature (°C.) | Stress (MPa) | Time for 1% Deformation (h) | Breaking Time (h) | Extension (%) |
| --- | --- | --- | --- | --- |
| 950 | 175 | 88 | 224 | 12.0 |

We claim:
1. A nickel-based superalloy suitable for monocrystalline directional solidification, which consists essentially of:
   Cr: 16% by weight
   Mo: 3% by weight
   Al: 3.5% by weight
   Ti: 3.5% by weight
   Ta: 3.5% by weight
   Ni: balance up to 100% by weight,
wherein the concentration of each of the elements Co, Hf, C, Zr and B is practically zero.
2. A gas turbine blade obtained by directional solidification of a superalloy according to claim 1.

* * * * *